United States Patent
Zhang

(10) Patent No.: US 7,039,843 B2
(45) Date of Patent: May 2, 2006

(54) MODELING CUSTOM SCAN FLOPS IN LEVEL SENSITIVE SCAN DESIGN

(75) Inventor: Aiteen Zhang, Westford, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 422 days.

(21) Appl. No.: 10/012,130

(22) Filed: Nov. 13, 2001

(65) Prior Publication Data

US 2003/0093733 A1 May 15, 2003

(51) Int. Cl.
*G01R 31/28* (2006.01)

(52) U.S. Cl. ..................................... 714/726
(58) Field of Classification Search ............... 714/726, 714/738, 724, 727, 728, 729, 741; 377/54, 377/64, 70, 73, 77, 81
See application file for complete search history.

(56) References Cited

U.S. PATENT DOCUMENTS

| | | | | |
|---|---|---|---|---|
| 3,783,254 A | | 1/1974 | Eichelberger ............... 235/152 |
| 4,293,919 A | | 10/1981 | Dasgupta et al. ........... 364/716 |
| 4,580,137 A | * | 4/1986 | Fiedler et al. ......... 340/825.68 |
| 4,855,669 A | * | 8/1989 | Mahoney .................. 324/73.1 |
| 5,257,233 A | * | 10/1993 | Schaefer .................... 365/227 |
| 5,463,338 A | | 10/1995 | Yurash ....................... 327/202 |
| 5,479,414 A | | 12/1995 | Keller et al. ................ 371/22.3 |
| 5,515,530 A | * | 5/1996 | Eskandari ...................... 714/1 |
| 5,633,812 A | | 5/1997 | Allen et al. .................. 364/578 |
| 5,920,575 A | * | 7/1999 | Gregor et al. .............. 714/726 |
| 6,023,778 A | * | 2/2000 | Li .............................. 714/726 |
| 6,219,811 B1 | | 4/2001 | Gruetzner et al. .......... 714/726 |
| 6,223,313 B1 | * | 4/2001 | How et al. ................... 714/724 |
| 6,327,685 B1 | * | 12/2001 | Koprowski et al. ......... 714/733 |
| 6,446,229 B1 | * | 9/2002 | Merrick et al. ............. 714/724 |

OTHER PUBLICATIONS

M. Morris Mano, "Flip-Flops", Computer System Architecture (2nd edition), Prentice-Hall, Inc., 1982, pp. 21-25.*

* cited by examiner

*Primary Examiner*—Christine T. Tu
(74) *Attorney, Agent, or Firm*—Lahive & Cockfield, LLP

(57) ABSTRACT

A system and method for testing an integrated circuit is provided. The illustrative embodiment provides a scan cell for use with automatic test pattern generation (ATPG). In the scan cell of the illustrative embodiment, a flip-flop is configured as a master storage element and a latch is configured as a slave storage element. During standard operating mode, the flip-flop and the latch operate as standard storage elements in the circuit. During a test mode, the flip-flop and the latch form a shift register for shifting test pattern data through the circuit to identify and detect any faults in the circuit design.

19 Claims, 5 Drawing Sheets

Latch Truth Table

| Di | CLKi | RESET | SET | Q | QN |
|---|---|---|---|---|---|
| 0 | 1 | 0 | 0 | 0 | 1 |
| 1 | 1 | 0 | 0 | 1 | 0 |
| ? | 0 | 0 | 0 | Q | QN |
| 1 | 1 | 1 | 0 | X | X |
| ? | 0 | 1 | 0 | 0 | 1 |
| 0 | 1 | 1 | 0 | 0 | 1 |
| 0 | 1 | 0 | 1 | X | X |
| 1 | 1 | 0 | 1 | 1 | 0 |
| ? | 0 | 0 | 1 | 1 | 0 |
| ? | ? | 1 | 1 | X | X |

*FIG. 4*

D Flip-Flop Truth Table

| D1 | CLK1 | SET | RESET | Q | QN |
|---|---|---|---|---|---|
| 0 | ^ | 0 | 0 | 0 | 1 |
| 1 | ^ | 0 | 0 | 1 | 0 |
| ? | - | 0 | 0 | Q | QN |
| 0 | ^ | 0 | 1 | 0 | 1 |
| 1 | ^ | 0 | 1 | X | X |
| ? | - | 0 | 1 | 0 | 1 |
| ? | ? | 0 | 1 | 0 | 1 |
| 0 | ^ | 1 | 0 | X | X |
| 1 | ^ | 1 | 0 | 1 | 0 |
| ? | - | 1 | 0 | 1 | 0 |
| ? | ? | 1 | 0 | 1 | 0 |
| ? | ? | 1 | 1 | X | X |

*FIG. 6*

MODELING CUSTOM SCAN FLOPS IN LEVEL SENSITIVE SCAN DESIGN

FIELD OF THE INVENTION

The present invention relates to testing integrated circuit designs using automatic test pattern generation (ATPG).

BACKGROUND OF THE INVENTION

An important step in the development and design of an integrated circuit is testing to detect faults in the circuit design. Testing of an integrated circuit generally involves adding partial or full scan to a circuit design using an ATPG program. The ATPG program generates a set of test patterns to identify faults in the integrated circuit design, which are applied to the input pins of the integrated circuit under test. The response of the integrated circuit to the test patterns is examined at the output pins of the integrated circuit to detect logic faults in the circuit design. A test pattern generally comprises a sequence of bits in the form of a vector, which is sequentially shifted through the storage elements of the integrated circuit.

FIG. 1 is a flow chart diagramming the steps involved in ATPG for testing an integrated circuit using an ATPG tool, such as FastScan or TetraMAX. A standard ATPG program generally initializes in step 10 by invoking a set of input information describing the integrated circuit under test. Typically, the input information comprises a netlist, such as a Verilog netlist, defining the circuit design and an ATPG library defining primitives and arrays for the circuit design. Verilog is a Hardware Description Language (HDL) for electronic design and gate level simulation and the netlist comprises a test file description of a physical connection of components in the circuit design. The ATPG program then switches to a setup mode and invokes a setup file containing list of commands in step 11. Next, in step 12, the ATPG program performs a scan extraction. Scan extraction involves reading the description of the circuit under test and calculating testability measurements for the circuit using design rules checking (DRC). The ATPG program identifies and debugs any design errors in the circuit in step 13.

The ATPG program then proceeds to fault simulation and test pattern generation. Test pattern generation may be random, sequential, or fast sequence test pattern generation. Fault simulation is used to simulate the circuit design on a computer to facilitate the identification of defects in the actual circuit. During fault simulation, possible defects are inserted into the simulated circuit design to simulate and anticipate the response of the circuit to these defects. In step 14, the ATPG program compiles a list of potential faults for the circuit and generates test patterns that simulate each fault in the list in step 15. The test generation algorithm creates test patterns that simulate each of the potential fault types for the circuit under test. In step 16, the test patterns are saved in various pattern formats. Generally, the test patterns are saved in Verilog VHDL, EDIF or any suitable format. In step 17, a fault coverage report is generated, which describes the percentage of potential faults from the fault list that are successfully simulated.

In step 18, the test patterns are applied to a circuit under test and the output response is analyzed to identify faults in the circuit design. The circuit under test is switched to a test mode and the patterns generated by the ATPG tool are shifted through a scan portion of the circuit and output to an output pin. The scan portion comprises a set of storage elements, which form a shift register in test mode. During playback, the output test patterns shifted output the circuit and the vectors generated during fault simulation are compared by an output analyzer. The output analyzer compares the expected response of the circuit to the actual response of the circuit to diagnose and isolate faults that cause failures in the circuit. In step 19, the results are printed to a file and a report identifying the faults detected in the circuit is generated.

"Scan design" refers to an electronic circuit design technique that facilitates testing of the circuit by making the storage elements of the circuit, which temporarily store logical states within the integrated circuit, scannable. Scan design involves incorporating scan registers into the circuit to form a scan path, thereby increasing the controllability and observability of the circuit. As discussed, the integrated circuit is tested by shifting a test vector generated by an ATPG program through the storage elements to ensure that the integrated circuit is functioning properly. Using scan design, the state of certain points in the circuit may be modified at any time by suspending normal operation and switching to a "test" mode. In standard operation, the shift registers perform normal operational tasks. The storage elements in the shift registers can be switched into a "test" mode and form a scan portion of the integrated circuit. During test mode, test pattern data can be clocked serially through all the scan registers and out of an output pin at the same time as new test pattern data is clocked in from an input pin.

Level Sensitive Scan Design (LSSD), developed by IBM, is a common type of scan design used with ATPG to test a circuit. LSSD uses separate system and scan clocks to distinguish between a standard operating mode and a test mode. In LSSD, level-sensitive latches used on-chip for state information are replaced by master-slave latch pairs, which are tied together into one long shift register. In standard operating mode, each storage-element is a level sensitive latch controlled by a system clock. For test operation, the latches form master/slave pairs, each pair having one scan input, one scan output and two non-overlapping scan clocks, which are held low during system operation but cause the scan data to be latched when pulsed high during scan. New state information is shifted in serially, allowing the core circuitry in the circuit to process this information, and shift out the modified state information to an output pin.

Current ATPG tools, such as those in the "FastScan" suite developed by Mentor Graphics and the "TetraMAX" suite developed by Synopsys, are used to analyze and classify probable defect sights using a simulation-based approach and a dynamic algorithm. However, many of the currently available ATPG tools used with LSSD cause significant fault coverage loss and test coverage loss and have a negative impact on the performance of the circuit. In other words, many potential design defects cannot be simulated and tested using these tools and of the design defects that can be simulated and tested for, many often go undetected.

SUMMARY OF THE INVENTION

The illustrative embodiment of the present invention provides a design-for-test scan cell in which the D flip-flops for a microprocessor are customized to resemble a traditional IBM Level Sensitive Scan Design (LSSD) model. According to the illustrative embodiment, a dual clock flip-flop primitive with dual data input is used as a master storage element and a basic latch is used as a slave storage element to form a scan path. The master flip-flop and the slave latch are connected to form a shift register for shifting test data through the circuit under test. Under normal operation, the flip-flop and the latch function as standard storage elements in the circuit. The scan cell may be switched to a test mode, wherein test data generated by ATPG is shifted through the master-slave pair, in order to test for faults in the circuit design.

The illustrative embodiment of the invention significantly improves the percentage of faults in a circuit design that are detected in ATPG tools, such as FastScan and TetraMAX. Moreover, testing of a microprocessor implementing the scan cell is simplified, and the testing procedure minimizes adverse effects on the performance of the microprocessor.

According to one embodiment, an integrated circuit having scan capabilities is provided. The integrated circuit comprises a first storage element comprising a flip-flop, a second storage element comprising a latch and circuitry coupling the first storage element to the second storage element. The first storage element and the second storage element form a shift register for shifting test data through the integrated circuit to detect faults.

According to another embodiment, a method of testing an integrated circuit is provided. The method comprises providing an integrated circuit having a master-slave pair storage element comprising flip-flop connected to a latch and shifting test data through the master-slave pair.

According to yet another embodiment, a system for testing an integrated circuit is provided. The system comprises a test pattern generator for generating a test pattern and a scan cell. The scan cell comprises a flip-flop and a latch configured to shift the test pattern through the integrated circuit.

BRIEF DESCRIPTION OF THE DRAWINGS

FIG. 4 is a truth table for a latch used in the LSSD scan cell of FIG. 3.

FIG. 6 is a truth table for a D flip-flop used in the scan cell illustrated in FIG. 5.

DETAILED DESCRIPTION

The illustrative embodiment provides an improved testing design for ATPG for detecting faults in an integrated circuit. The illustrative embodiment enables automatic testing of integrated circuit designs and provides a high fault coverage without compromising performance. The illustrative embodiment is implemented in the design and testing of UltraSparc processors, developed by Sun Microsystems. One skilled in the art will recognize that the invention is not limited to UltraSparc processors and may be utilized to design and test any suitable integrated circuit.

Figure 1:
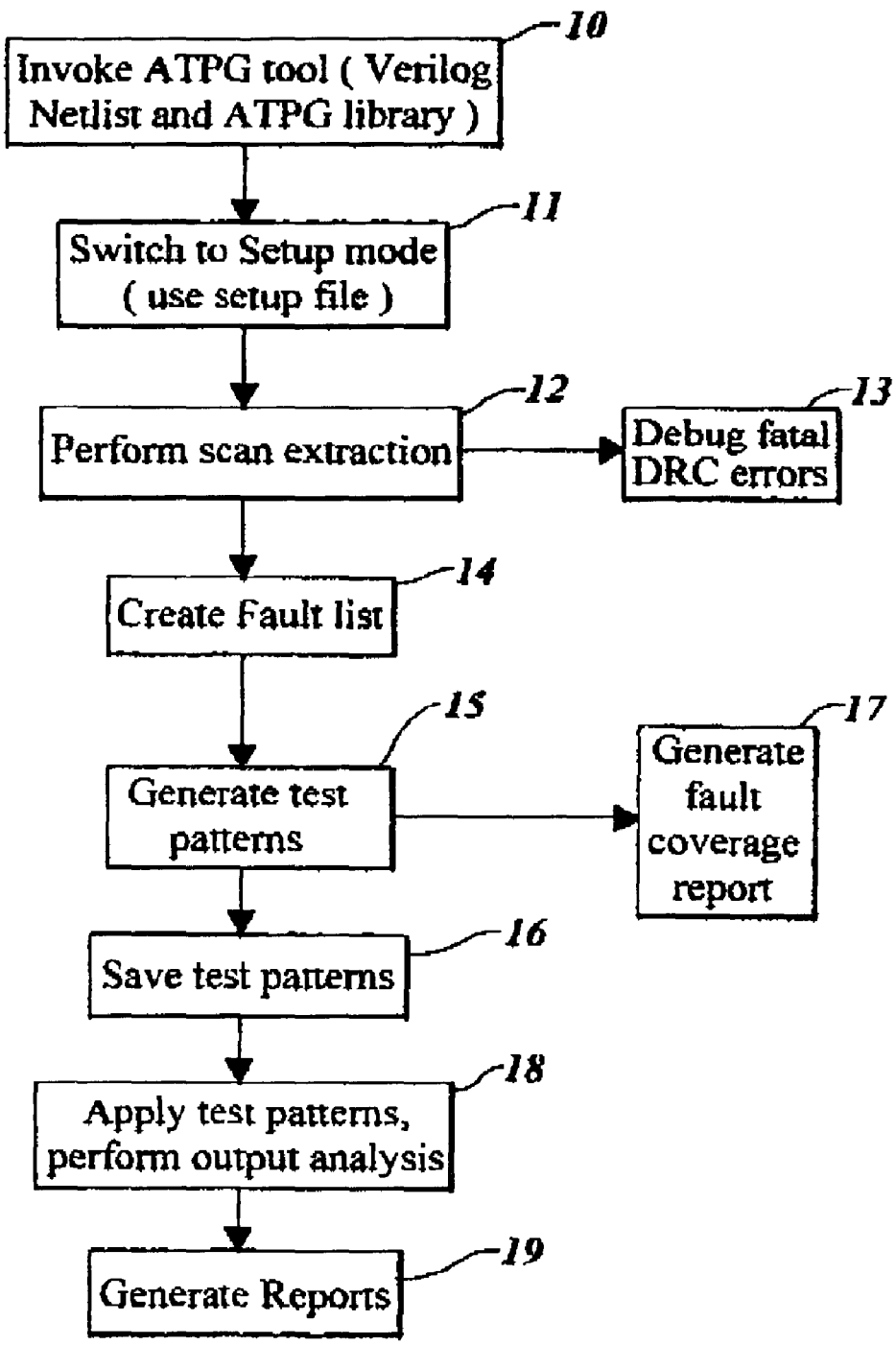
FIG. 1 illustrates the steps involved in performing conventional ATPG for testing an integrated circuit.

The scan cell of the illustrative embodiment of the present invention scans test patterns generated via ATPG to test a circuit design. Test data generated by the ATPG process illustrated in FIG. 1 is shifted through the scan cell of the illustrative embodiment during test mode to detect faults in the circuit design. One skilled in the art will recognize that the present invention is not limited to these ATPG tools, and that any suitable ATPG tool for generating test vectors for testing an integrated circuit design may be utilized. ATPG tools analyze and classify probable defect sites in a circuit using a simulation-based approach and a dynamic algorithm. As discussed, test patterns generated via ATPG are applied to the circuit under test and the output response is analyzed to identify faults in the circuit design. The circuit under test is switched to a test mode, and the test patterns generated by the ATPG tool are shifted through a scan portion of the circuit and output to an output pin. The scan portion generally comprises a set of storage elements, which form a shift register in test mode.

Figure 2A:
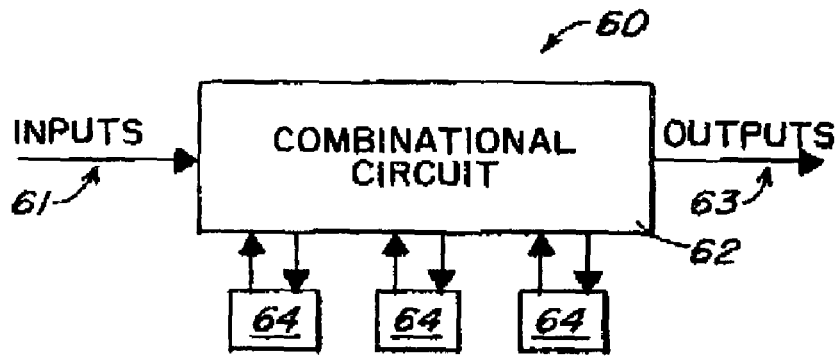
FIG. 2a is a block diagram of an integrated circuit during standard operating mode.
Figure 2B:
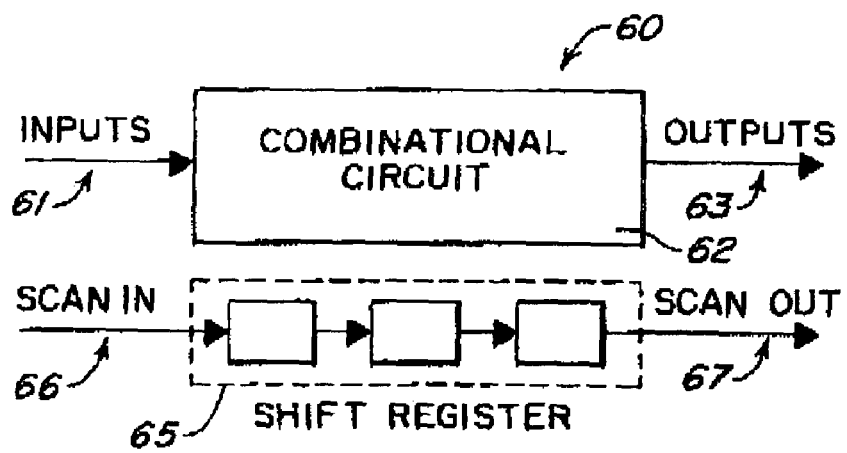
FIG. 2b is a block diagram of an integrated circuit during test mode.

FIGS. 2a and 2b illustrate a circuit incorporating scan design to allow testing of the circuit using ATPG. FIG. 2a is a diagram of an integrated circuit 60 during standard operating mode. In FIG. 2a, the integrated circuit comprises a set of primary inputs 61 connected to combinational logic 62 and a set of primary outputs 63 connected to the combinational logic 62. As shown, storage elements 64 are also connected to the combinational logic and store data from the combinational logic 62. FIG. 2b illustrates the integrated circuit 60 of FIG. 2a during test mode, wherein the memory elements 64 are made scannable. During test mode, the normal data flow between the storage elements 64 and the combinational logic 62 is disabled and the storage elements 64 form scan cell 65, comprising a shift register for shifting test data generated by ATPG through the circuit. Test data is shifted in at a scan input 66 and shifted out for observation and measurement at a scan output 67.

Figure 3:
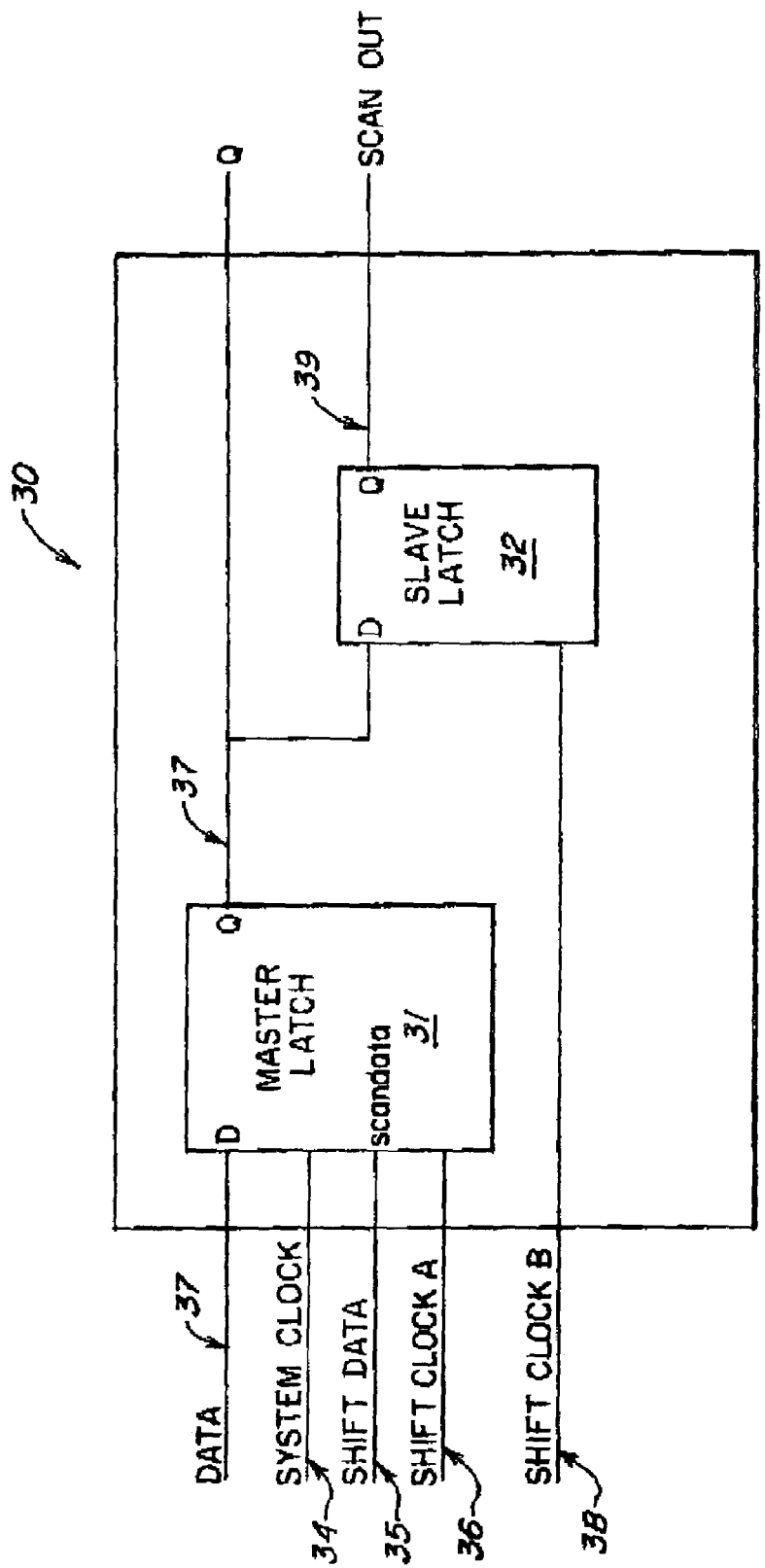
FIG. 3 illustrates a traditional LSSD scan cell of the prior art.

FIG. 3 is a diagram of a conventional LSSD scan cell 30 forming the scan portion of a circuit during testing of the circuit. The scan cell includes a master latch 31 and a slave latch 32. A latch generally comprises a level-sensitive digital logic circuit used to store one or more bits. A latch has a data input, a clock input and an output. When the clock input is active, data on the input is "latched" or stored and transferred to the output either immediately or when the clock input goes inactive. The output of the latch retains its value until the clock goes active again. A truth table for a latch is illustrated in FIG. 4. As shown, the output Q of a latch depends on the value of the data input and the clock input. In the illustrated design, the set and reset inputs are kept low.

In a standard operating mode, the latches 31, 32 operate as normal storage elements. The inputs to the master latch 31 for the standard operating mode are a data line 33 and a system clock 34. During standard operating mode, data from the combinational logic of the circuit is shifted through data line 33 and stored in the latches 31, 32 under the control of the system clock 34. In a test mode, the latches 31, 32 are tied together into a master-slave pair and operate as one long shift register. The inputs comprising the shift portion of the scan cell 30 are a scan data line 35 for shifting test data generated by ATPG into the master latch 31 and an "A" clock 36 for controlling the shifting of test data into the scan cell master latch. When the "A" clock is pulsed high, test data is latched in the master clock. The master latch produces a Q output 37 depending on the active clock and data inputs. In test mode, the master latch Q output 37 is transferred to the input of the slave latch 32. A "B" clock 38 controls the shifting of data through the slave latch 32. When the "B" clock 38 is pulsed high, the output 37 of the master latch is latched. The scan data output is developed at the Q output 39 of the slave latch, where it is examined to detect faults, according to ATPG protocol. The test mode for testing the circuit is activated by de-activating the system clock 34, which isolates all of the latch circuits from one another and permits the scan-in/scan-out operations to be performed. The A and B clocks 36, 38 are held low during normal system operation, and are activated to switch the scan cell to test mode, causing scan data generated by ATPG to be latched when the A and B clocks 36, 38 are pulsed high.

Figure 5:
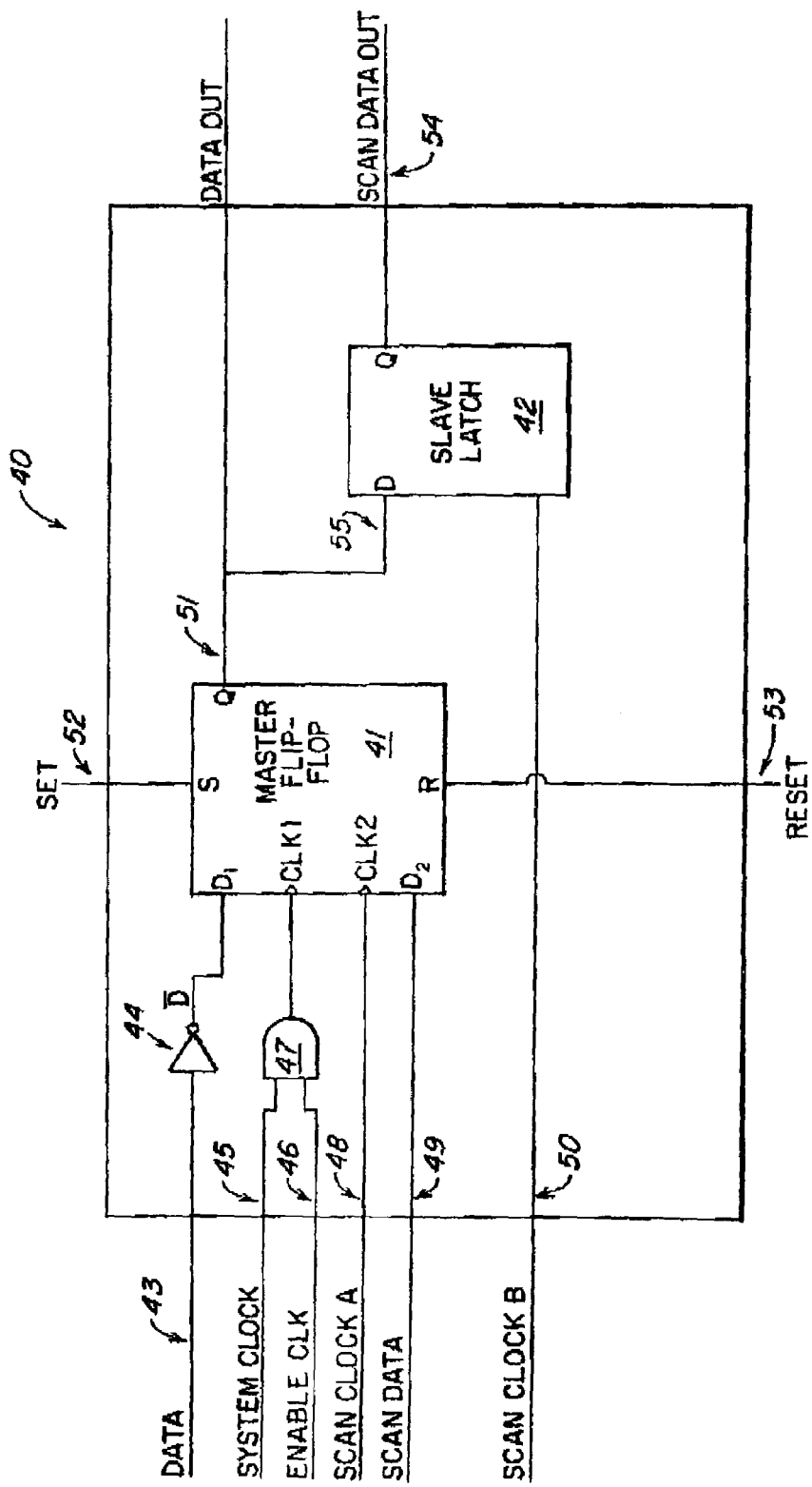
FIG. 5 illustrates a scan cell according to the illustrative embodiment of the invention.

A scan cell according to the illustrative embodiment of the invention is illustrated in FIG. 5. As shown, the scan cell 40 of the illustrative embodiment comprises a D flip-flop 41 paired with a standard latch 42 to form a master-slave pair. As known in the art, flip-flops are edge-triggered storage elements, while latches comprise level-sensitive storage elements.

In the illustrative embodiment, the flip-flop 41 comprises a master storage element and the latch 42 comprises a slave storage element for shifting test patterns through the scan cell to detect faults in the circuit. A normal data line 43 is provided for passing data from the combinational logic of the circuit to the flip-flop 41 to store the data during standard operation. The normal data line 43 for the master flip-flop 41 passes through a NOT logic gate 44 to invert the data signal. The inverted data signal is then passed to the normal data input of the flip-flop 41. A system clock 45 corresponds to the normal operation mode and is used to control the storage of data from the combinational logic of the circuit during standard operation. An "enable" clock 46 is used to activate and de-activate the system clock to allow the scan cell 40 to switch between a normal operation mode and a test mode. The system clock 45 and the enable clock 46 pass through an AND logic gate 47. When the enable clock is high, the system clock is activated. When the enable clock is low, the system clock is de-activated, and the output from the AND logic gate 47 is low, independent of the value of the system clock 45. A master scan clock 48 and a scan data line 49 are inputs to the master flip-flop 41. Test patterns are shifted into the scan cell 40 through the scan data line 49 during test mode under the control of the master scan clock 48. Test data is first shifted through the master flip-flop 41 to the Q output 51. The test data is then shifted from the Q output 51 to the input 55 of the slave storage element, latch 42. The latch 42 has a slave scan clock 50 for controlling the shifting of data into the latch 42. The scan output 54 of the latch 42 forms the scan-out data, which, during test mode, is measured and examined to diagnose faults in the circuit and determine if the circuit is functioning properly, as discussed above.

A truth table for the D flip-flop 41 used in the master storage element of the scan cell 40 is shown in FIG. 6. According to the illustrative embodiment, the master flip-flop 41 comprises a "set/reset" flip-flop, wherein a set line 52 and a reset line 53 are used to set the state of the flip-flop 41. In the illustrative embodiment, the set line 52 and the reset line 53 are normally held low. When the set and reset are held low, the output of the flip-flop 41 is controlled by the edge of the active clock. As shown, when the active clock is rising, indicated by a "^" character, the active input D1 of the flip-flop is transferred immediately to the output Q. When the active clock is falling, indicated by a "−" character, the Q output of the flip-flop maintains its previous value, independent of the value of the D1 input.

As discussed, during a test mode, test pattern data generated by ATPG is clocked into the scan cell 40 and shifted out for measurement to determine the functional response of the circuit. In the illustrative scan cell, the design is switched to a test mode by keeping the enable clock 46 low. Test patterns generated by an ATPG tool to simulate faults are applied to the scan cell of the illustrative embodiment during test mode and the scan output at 54 is measured and recorded. The scan output is then compared to a fault simulator output as described above. The scan structure of the illustrative embodiment enables and enhances ATPG by providing a serial data path for shifting test data through the circuit.

The illustrative embodiment of the present invention provides significant improvements to fault coverage and test coverage when testing an integrated circuit. An increase in fault and test coverage significantly improves the reliability of testing and ensures that a circuit design with few faults is designed and manufactured. Moreover, the scan design of the illustrative embodiment is relatively simple to implement and add to a circuit design without disrupting the performance of the circuit.

The described embodiment is merely illustrative and should not be considered restrictive in any way. Details of the scan design may vary substantially without departing from the spirit of the invention, and exclusive use of all modifications that come within the scope of the appended claims is reserved. It is intended that the invention be limited only to the extent required by the appended claims and the applicable rules of law. The scope of the invention is to be measured by the appended claims, rather than the preceding description, and all variations and equivalents that fall within the range of the claims are intended to be embraced therein

The invention claimed is:

1. An integrated circuit having scan capabilities, comprising
   a first storage element comprising an edge sensitive dual clock flip-flop with dual data input;
   a second storage element comprising a level sensitive latch; and
   circuitry coupling the first storage element to the second storage element, wherein the first storage element and the second storage element form a shift register for shifting test data through the integrated circuit to detect faults.

2. The integrated circuit of claim 1, wherein the edge sensitive dual clock flip-flop with dual data input and the level sensitive latch form a shift register during a test mode.

3. The integrated circuit of claim 1, wherein the first storage element forms a master storage element and the second storage element forms a slave storage element during a test mode.

4. The integrated circuit of claim 3, further comprising an enable clock input for activating said test mode.

5. The integrated circuit of claim 1, wherein the edge sensitive dual clock flip-flop with dual data input comprises a standard data input used in a standard operating mode and a shift data input used in a test mode.

6. The integrated circuit of claim 1, wherein the edge sensitive dual clock flip-flop with dual data input comprises a set/reset flip-flop with dual data input.

7. A method of testing an integrated circuit, comprising:
   providing an integrated circuit having a master-slave pair storage element comprising an edge sensitive dual clock flip-flop with dual data input connected to a level sensitive latch; and shifting test data through the master-slave pair.

8. The method of claim 7, further comprising the step of monitoring the test data at an output pin of the integrated circuit using an ATPG tool.

9. The method of claim 8, wherein the edge sensitive dual clock flip-flop with dual data input comprises a master storage element and the level sensitive latch comprises a slave storage element.

10. The method of claim 8, wherein the test data is observed at a scan output of the level sensitive latch.

11. The method of claim 8, wherein observation of the test data of the scan output of the level sensitive latch comprises a step of running a fault simulator.

12. The method of claim 7, further comprising the step of generating said test data.

13. The method of claim 12, wherein the test data is generated using an ATPG program.

14. A system for testing an integrated circuit, comprising:
   a test pattern generator for generating a test pattern; and
   scan cell comprising an edge sensitive dual clock flip-flop with dual data input and a level sensitive latch configured to shift said test pattern through the integrated circuit.

15. The system of claim 14, wherein the edge sensitive dual clock flip-flop with dual data input and the level sensitive latch comprise a master-slave pair.

16. The system of claim 15, wherein said master-slave pair forms a shift register.

17. The system of claim 14, further comprising an output analyzer for analyzing a response of the circuit to the test pattern and detecting a fault in the circuit.

18. The system of claim 14, further comprising a fault simulator for simulating potential faults in the circuit.

19. The system of claim 14, wherein the scan cell further comprises an enable clock for switching the scan cell from an operating mode to a test mode.

* * * * *